US012647125B2

(12) United States Patent
Huang et al.

(10) Patent No.: US 12,647,125 B2
(45) Date of Patent: Jun. 2, 2026

(54) DIGITAL-TO-ANALOG CONVERSION APPARATUS AND METHOD HAVING SIGNAL CALIBRATION MECHANISM

(71) Applicant: REALTEK SEMICONDUCTOR CORPORATION, Hsinchu (TW)

(72) Inventors: Shih-Hsiung Huang, Hsinchu (TW); Hsuan-Ting Ho, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 166 days.

(21) Appl. No.: 18/764,702

(22) Filed: Jul. 5, 2024

(65) Prior Publication Data

US 2025/0047292 A1    Feb. 6, 2025

(30) Foreign Application Priority Data

Aug. 4, 2023    (TW) .................................. 112129359

(51) Int. Cl.
*H03M 1/10* (2006.01)
*H03M 1/66* (2006.01)

(52) U.S. Cl.
CPC ........... *H03M 1/1042* (2013.01); *H03M 1/66* (2013.01)

(58) Field of Classification Search
CPC ............................... H03M 1/1042; H03M 1/66

USPC ................................................... 341/120, 144
See application file for complete search history.

(56) References Cited

U.S. PATENT DOCUMENTS

| | | | |
|---|---|---|---|
| 11,894,856 B2 | 2/2024 | Ho | |
| 2022/0345139 A1* | 10/2022 | Ho | H03M 1/1023 |
| 2023/0183744 A1 | 6/2023 | Huang | |
| 2023/0308108 A1 | 9/2023 | Ho | |

* cited by examiner

*Primary Examiner* — Khai M Nguyen
(74) *Attorney, Agent, or Firm* — WPAT, PC

(57) ABSTRACT

The present disclosure discloses a digital-to-analog conversion apparatus having a signal calibration mechanism. A conversion circuit performs digital-to-analog conversion on a digital signal to generate an output analog signal. An echo transmission circuit performs down-sampling on an echo path that the output analog signal passes through to generate an echo signal. Selected data and non-selected data included in N input parts of the input digital signal are treated as a pseudo-noise input and a signal input by N calibration circuits in an echo calibration circuit so as to be mapped by codeword offset tables and processed by groups of response coefficients to generate N calibration parts of a calibration signal. A calibration parameter calculation circuit generates offsets according to the echo signal, converges the response coefficients according to an error signal and pseudo noise transmission path information and updates the codeword offset tables accordingly.

20 Claims, 4 Drawing Sheets

100

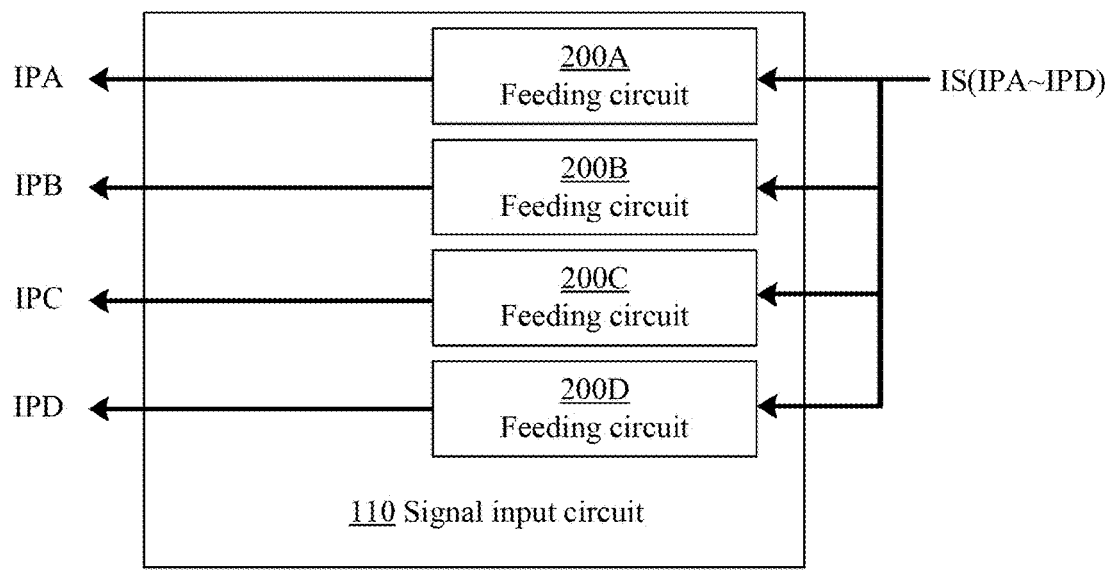

IPA ← 200A Feeding circuit ← IS(IPA~IPD)

IPB ← 200B Feeding circuit

IPC ← 200C Feeding circuit

IPD ← 200D Feeding circuit

110 Signal input circuit

Fig. 2

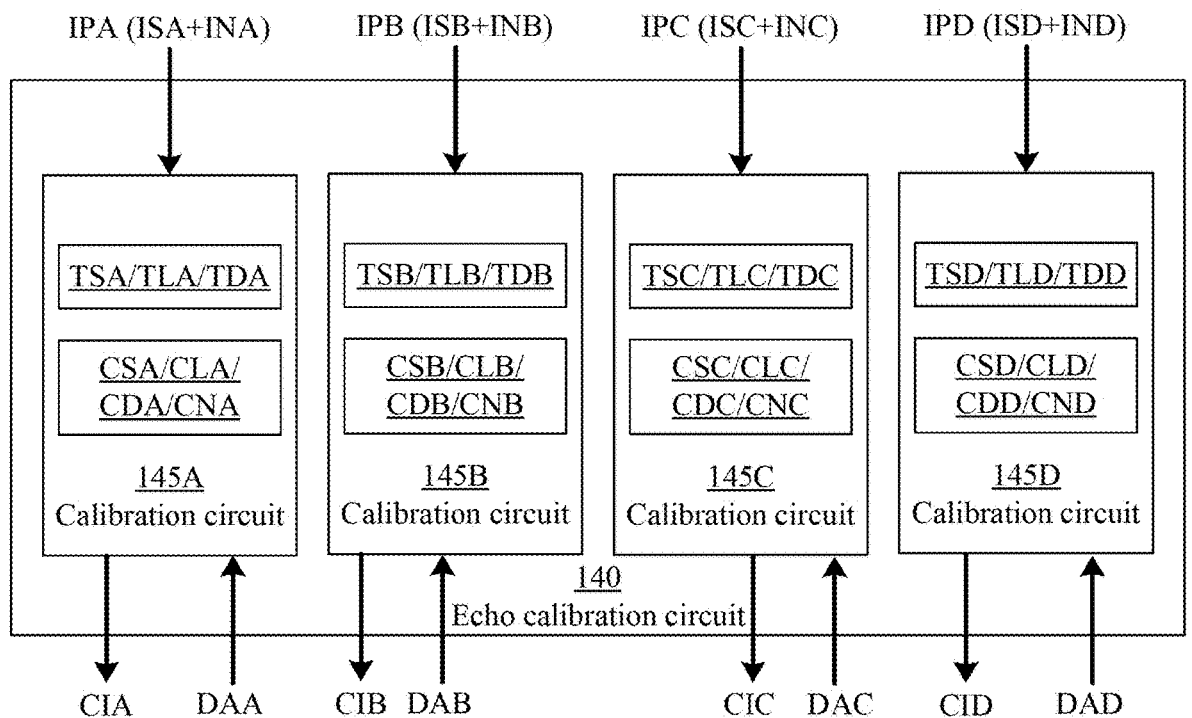

IPA (ISA+INA)          IPB (ISB+INB)          IPC (ISC+INC)          IPD (ISD+IND)

TSA/TLA/TDA          TSB/TLB/TDB          TSC/TLC/TDC          TSD/TLD/TDD

CSA/CLA/CDA/CNA          CSB/CLB/CDB/CNB          CSC/CLC/CDC/CNC          CSD/CLD/CDD/CND

145A Calibration circuit          145B Calibration circuit          145C Calibration circuit          145D Calibration circuit

140 Echo calibration circuit

CIA    DAA          CIB    DAB          CIC    DAC          CID    DAD

Fig. 3A

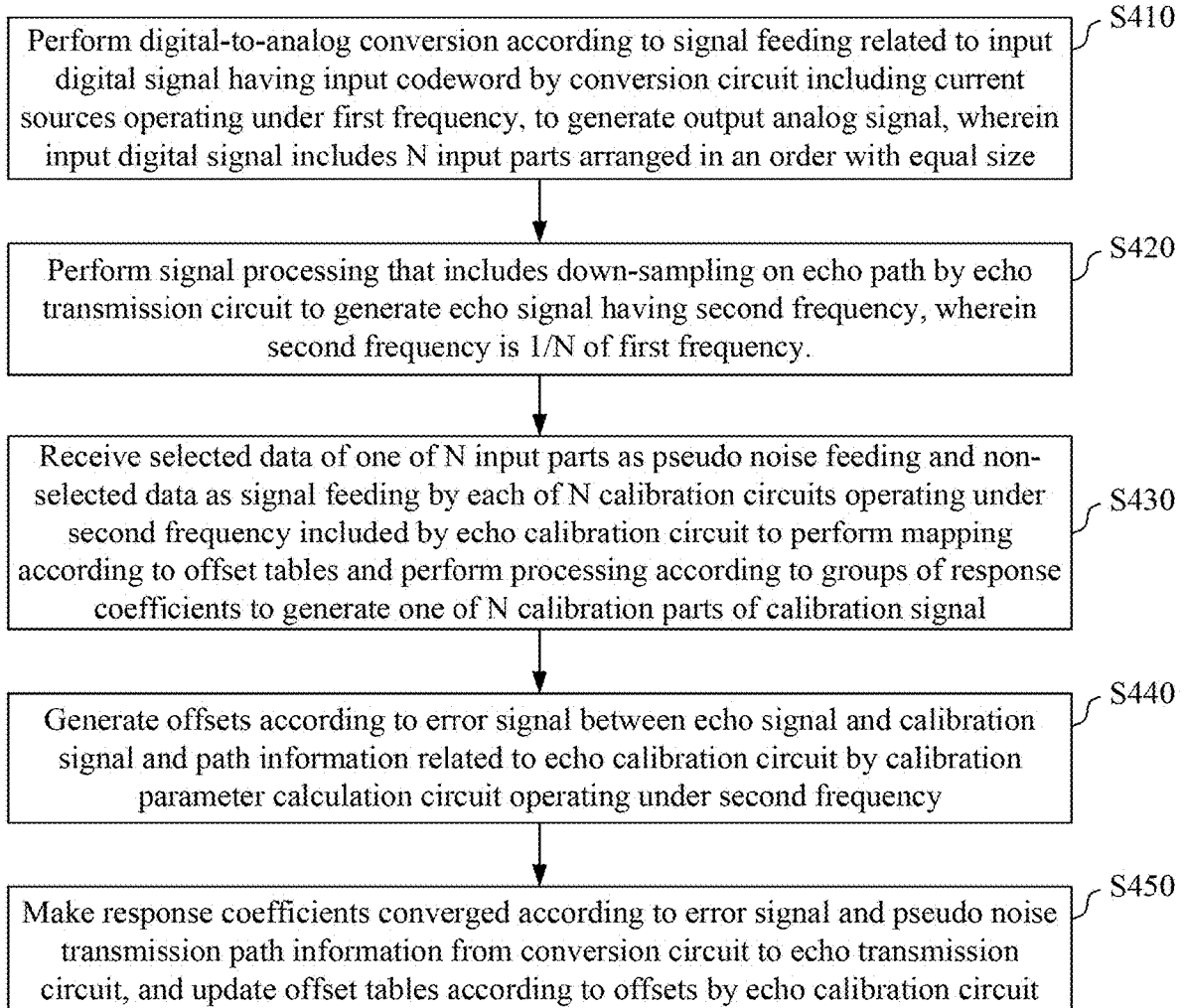

400

S410
Perform digital-to-analog conversion according to signal feeding related to input digital signal having input codeword by conversion circuit including current sources operating under first frequency, to generate output analog signal, wherein input digital signal includes N input parts arranged in an order with equal size S420
Perform signal processing that includes down-sampling on echo path by echo transmission circuit to generate echo signal having second frequency, wherein second frequency is 1/N of first frequency.

S430
Receive selected data of one of N input parts as pseudo noise feeding and non-selected data as signal feeding by each of N calibration circuits operating under second frequency included by echo calibration circuit to perform mapping according to offset tables and perform processing according to groups of response coefficients to generate one of N calibration parts of calibration signal S440
Generate offsets according to error signal between echo signal and calibration signal and path information related to echo calibration circuit by calibration parameter calculation circuit operating under second frequency S450
Make response coefficients converged according to error signal and pseudo noise transmission path information from conversion circuit to echo transmission circuit, and update offset tables according to offsets by echo calibration circuit

Fig. 4

DIGITAL-TO-ANALOG CONVERSION APPARATUS AND METHOD HAVING SIGNAL CALIBRATION MECHANISM

BACKGROUND OF THE INVENTION

1. Field of the Invention

The present disclosure relates to a digital-to-analog conversion apparatus and a digital-to-analog conversion method having a signal calibration mechanism.

2. Description of Related Art

A digital-to-analog conversion apparatus is an important circuit component to convert a signal from a digital form to an analog form. The digital-to-analog conversion apparatus multiplies different digital codes by corresponding conversion gain values to generate analog signals having different intensities.

However, an error is generated in the digital-to-analog conversion apparatus due to offsets of current sources therein. Further, an echo is generated due to the mismatch of a transmission path that transmits the signal. Different calibration technologies are required for the digital-to-analog conversion apparatus to perform calibration on the input signal and the output signal to accomplish a better conversion result.

SUMMARY OF THE INVENTION

In consideration of the problem of the prior art, an object of the present disclosure is to provide a digital-to-analog conversion apparatus and a digital-to-analog conversion method having a signal calibration mechanism.

The present invention discloses a digital-to-analog conversion apparatus having a signal calibration mechanism that includes a conversion circuit, an echo transmission circuit, an echo calibration circuit and a calibration parameter calculation. The conversion circuit includes a plurality of current sources operating under a first frequency to perform digital-to-analog conversion according to a signal feeding related to an input digital signal having a set of input codeword to generate an output analog signal, wherein the input digital signal includes N input parts arranged in an order with an equal size, N being a positive integer larger than 1. The echo transmission circuit performs signal processing that includes down-sampling on an echo path to generate an echo signal having a second frequency, wherein the second frequency is 1/N of the first frequency. The echo calibration circuit includes N calibration circuits operating under the second frequency, each receiving a piece of selected data of one of the N input parts as a pseudo noise feeding and a plurality of pieces of non-selected data as a signal feeding to perform mapping according to a plurality of offset tables and perform processing according to a plurality of groups of response coefficients to generate one of N calibration parts of a calibration signal. The calibration parameter calculation circuit operates under the second frequency to generate a plurality of offsets according to an error signal between the echo signal and the calibration signal and path information related to the echo calibration circuit, wherein the echo calibration circuit makes the groups of response coefficients converge according to the error signal and pseudo noise transmission path information from the conversion circuit to the echo transmission circuit, and further updates the offset tables according to the offsets.

The present invention also discloses a digital-to-analog conversion method having a signal calibration mechanism used in a digital-to-analog conversion apparatus that includes steps outlined below. Digital-to-analog conversion is performed according to a signal feeding related to an input digital signal having a set of input codeword by a conversion circuit including a plurality of current sources operating under a first frequency, to generate an output analog signal, wherein the input digital signal includes N input parts arranged in an order with an equal size, N being a positive integer larger than 1. Signal processing that includes down-sampling is performed on an echo path by an echo transmission circuit to generate an echo signal having a second frequency, wherein the second frequency is 1/N of the first frequency. A piece of selected data of one of the N input parts is received as a pseudo noise feeding and a plurality of pieces of non-selected data are received as a signal feeding by each of N calibration circuits operating under the second frequency included by an echo calibration circuit, to perform mapping according to a plurality of offset tables and perform processing according to a plurality of groups of response coefficients to generate one of N calibration parts of a calibration signal. A plurality of offsets are generated according to an error signal between the echo signal and the calibration signal and path information related to the echo calibration circuit by a calibration parameter calculation circuit operating under the second frequency. The groups of response coefficients are converged according to the error signal and pseudo noise transmission path information from the conversion circuit to the echo transmission circuit, and the offset tables are further updated according to the offsets by the echo calibration circuit.

These and other objectives of the present disclosure will no doubt become obvious to those of ordinary skill in the art after reading the following detailed description of the preferred embodiments that are illustrated in the various figures and drawings.

BRIEF DESCRIPTION OF THE DRAWINGS

FIG. 2 is a more detailed block diagram of the signal input circuit according to an embodiment of the present invention.

FIG. 3A illustrates a more detailed block diagram of the echo calibration circuit according to an embodiment of the present invention.

FIG. 4 illustrates a flow chart of a digital-to-analog conversion method having a signal calibration mechanism according to an embodiment of the present invention.

DETAILED DESCRIPTION OF THE PREFERRED EMBODIMENTS

An aspect of the present invention is to provide a digital-to-analog conversion apparatus and a digital-to-analog conversion method having a signal calibration mechanism that generate an output analog signal and an echo canceling analog signal each having a first frequency, to operate internal circuits under a second frequency that is 1/N of the first frequency by down-sampling an echo signal and further use partial information of the input digital signal as a pseudo noise feeding such that a calibration of the echo canceling mechanism can be performed without an additional pseudo noise generating source.

Figure 1:
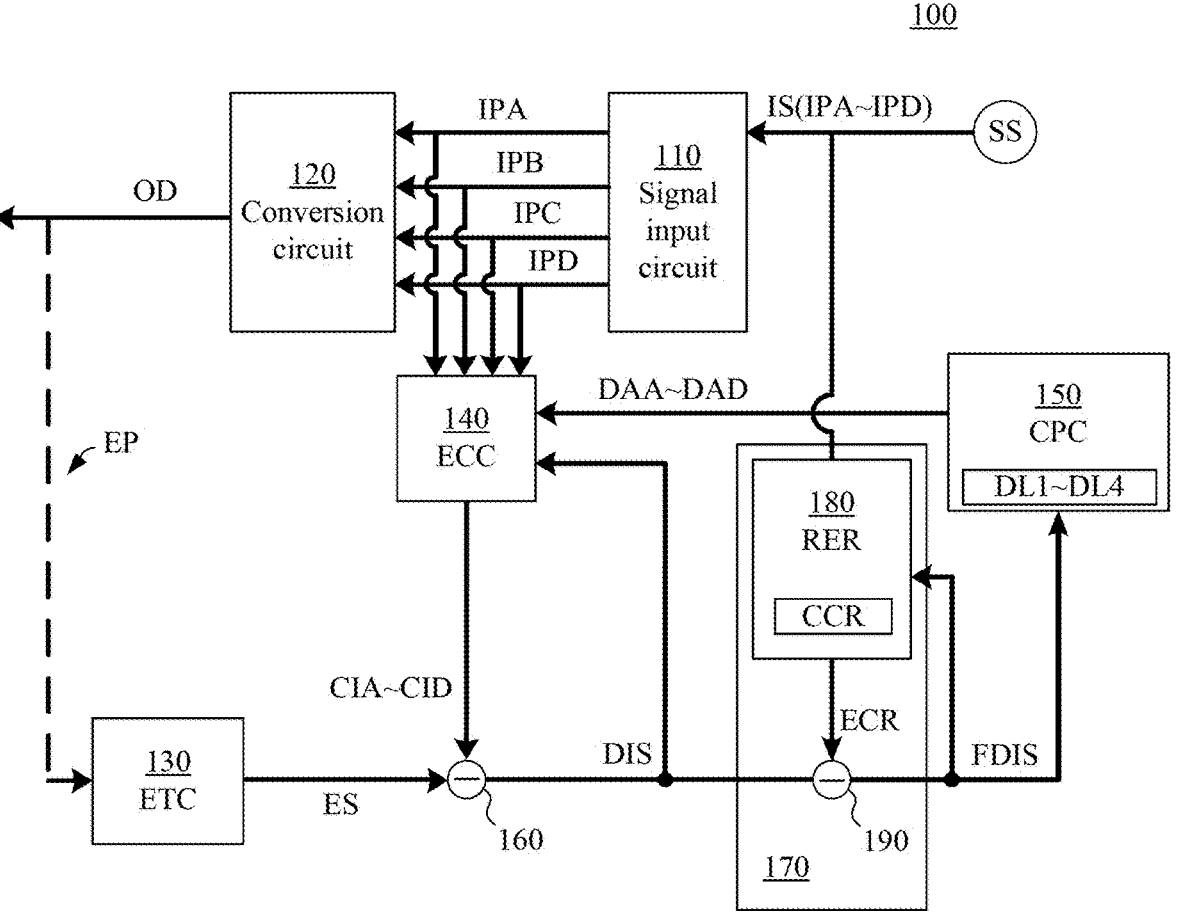
FIG. 1 illustrates a block diagram of a digital-to-analog conversion apparatus having a signal calibration mechanism according to an embodiment of the present invention.

Reference is now made to FIG. 1. FIG. 1 illustrates a circuit diagram of a digital-to-analog conversion apparatus 100 having a signal calibration mechanism according to an embodiment of the present invention. The digital-to-analog conversion apparatus 100 includes a signal input circuit 110, a conversion circuit 120, an echo transmission circuit 130 (abbreviated as ETC in FIG. 1), an echo calibration circuit 140 (abbreviated as ECC in FIG. 1) and a calibration parameter calculation circuit 150 (abbreviated as CPC in FIG. 1).

FIG. 2 is a more detailed block diagram of the signal input circuit 110 according to an embodiment of the present invention.

The signal input circuit 110 includes N feeding circuits. In the embodiment in FIG. 2, N is 4. As a result, the signal input circuit 110 included 4 feeding circuits 200A~200D.

The signal input circuit 110 performs signal feeding on the conversion circuit 120 according to an input digital signal IS. In an embodiment, the signal input circuit 110 receives the input digital signal IS from a signal source SS illustrated in FIG. 1, which can be a transmitter (TX) of a communication system. The input digital signal IS is generated by over-sampling an original digital signal (not illustrated in the figure) having a set of original codeword.

For example, the original digital signal can be a signal operated under 400 mega hertz (MHz) and has the set of original codeword having such as, but not limited to 64 values of 4, 8, 12, . . . and 256. The input digital signal IS can be generated by performing 4-time over-sampling on the original digital signal so as to become a signal operated under 1600 MHz and having a set of input codeword having such as, but not limited to 256 values of 1, 2, 3, . . . and 256.

Each of the feeding circuit 200A~200D of the signal input circuit 110 retrieves and outputs one of N input parts of the input digital signal IS. More specifically, each of the 4 feeding circuits 200A~200D retrieves and outputs one of the 4 input parts IPA~IPD of the input digital signal IS. In an embodiment, the 4 input parts IPA~IPD can be represented by phases respectively corresponding to 90 degrees, 180 degrees, 270 degrees, and 360 degrees and respectively labeled as 090, 180, 270 and 360 next to the input parts IPA~IPD in FIG. 2.

The conversion circuit 120 operates under the first frequency that is such as, but not limited to 1600 MHz. The conversion circuit 120 performs digital-to-analog conversion according to the signal feeding related to the input digital signal IS to generate an output analog signal OD. The output analog signal OD is the signal actually transmitted to an external terminal. However, the output analog signal OD may be leaked to a receiver (RX, not illustrated in the figure) through an echo path EP in FIG. 1. In an embodiment, a resistor (not illustrated in the figure) can be disposed on the echo path EP to divide the voltage thereon to perform echo canceling.

The echo transmission circuit 130 in FIG. 1 performs signal processing that includes down-sampling on the echo path EP to generate an echo signal ES having a second frequency that is 1/N of the first frequency. Since the first frequency in the example described above is 1600 MHz and N is 4, the second frequency is 400 MHz. The signal processing includes such as but not limited to echo response processing and analog-to-digital conversion performed based on down-sampling to generate the echo signal ES.

The conversion circuit 120 described above includes a plurality of current sources (not illustrated in the figure) to generate the analog signal according to the control of the corresponding signal feeding. The current sources include thermometer-controlled current sources and binary-controlled current sources. In an embodiment, the current sources include 15 thermometer-controlled current sources represented by T01~T15 and 4 binary-controlled current sources represented by B01~B04, each controlled by the input codeword to be electrically coupled to different voltage sources to output one of a positive voltage and a negative voltage.

In an embodiment, each of the thermometer-controlled current sources outputs a positive/negative voltage of a single unit. The 4 binary-controlled current sources respectively output a positive/negative voltage of $\frac{1}{2}$, $\frac{1}{4}$, $\frac{1}{8}$ and $\frac{1}{16}$ units. As a result, under the control of the input codeword, the 256 values correspond to the voltages ranging from −15.9375 units to +15.9375 units.

For example, when the value of the input codeword is 60, the 12 higher bits of the thermometer-controlled current sources T01~T12 output the negative voltages and the 3 lower bits of the thermometer-controlled current sources T13~T15 output the positive voltages. The first, the third and the fourth binary-controlled current sources B01, B03 and B04 output the positive voltages and the second binary-controlled current source B02 outputs the negative voltage. The total outputted voltage is −8.5625 units.

Each of the current sources described above has a current offset such that the analog signal includes a static mismatch error. Moreover, different turn-on times of these current sources also result in mismatch errors, in which an earlier turn-on time results in a lead mismatch error and a later turn-on time results in a delay mismatch error.

The echo calibration circuit 140 cancels the static mismatch error, the lead mismatch error and the delay mismatch error generated from each of the conversion circuits.

The echo calibration circuit 140 includes N calibration circuits operating under the second frequency, each receiving a piece of selected data of one of the N input parts as a pseudo noise feeding and a plurality of pieces of non-selected data as a signal feeding to perform mapping according to a plurality of offset tables and perform processing according to a plurality of groups of response coefficients to generate one of N calibration parts of a calibration signal.

Figure 3B:
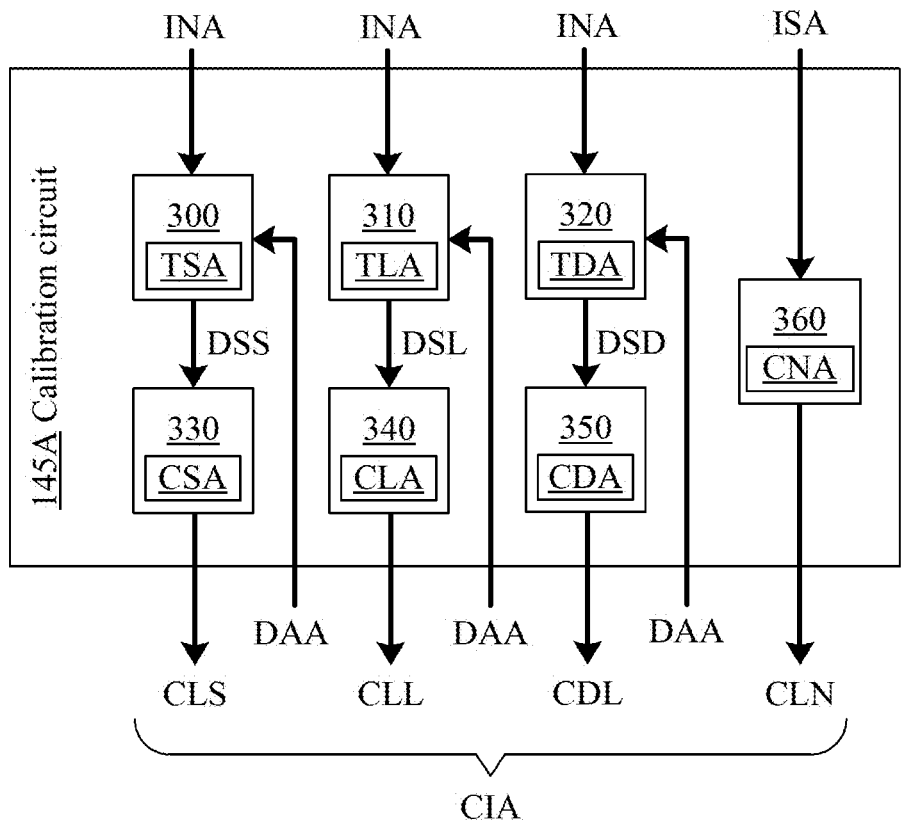
FIG. 3B illustrates a more detailed block diagram of one of the calibration circuits included by the echo calibration circuit according to an embodiment of the present invention.

Reference is now made to FIG. 3A and FIG. 3B at the same time. FIG. 3A illustrates a more detailed block diagram of the echo calibration circuit 140 according to an embodiment of the present invention. FIG. 3B illustrates a more detailed block diagram of one of the calibration circuits included by the echo calibration circuit 140 according to an embodiment of the present invention.

Since N is 4 in the present embodiment, the echo calibration circuit 140 includes 4 calibration circuits 145A~145D. FIG. 3B is illustrated by using the calibration circuit 145A as an example. Each of the calibration circuits 145A~145D receives one of the input parts IPA~IPD.

In an embodiment, the current sources of the conversion circuit 120 include a selected current source and a plurality of non-selected current sources. The piece of selected data corresponds to the selected current source and the pieces of non-selected data correspond to the non-selected current sources. Among the N input parts and the original codeword, the piece of selected data has a minimum data correlation with the pieces of non-selected data.

In the example that the conversion circuit 120 includes 15 thermometer-controlled current sources T01~T15 and 4 binary-controlled current sources B01~B04, the binary-controlled current source B01 and the thermometer-controlled current source T08 are the most appropriate candidates of the selected current source. Take the condition that the binary-controlled current source B01 serves as the selected current source as an example, the thermometer-controlled current sources T01~T15 and the binary-controlled current sources B02~B04 serve as the non-selected current sources. As a result, the 4 input parts IPA~IPD include the pieces of selected data ISA~ISD and the pieces of non-selected data INA~IND. The pieces of selected data ISA~ISD correspond to the binary-controlled current source B01 and the pieces of non-selected data INA~IND correspond to other current sources.

The calibration circuits 145A~145D included in the echo calibration circuit 140 respectively receive the pieces of selected data ISA~ISD as the pseudo noise feeding and receive the pieces of non-selected data INA~IND as the signal feeding to generate to the calibration parts CIA~CID. In the calibration circuit 145A illustrated in FIG. 3B, the input part IPA serves as the corresponding input part of the calibration circuit 145A and the calibration part CIA serve as the corresponding calibration part of the calibration circuit 145A.

The calibration circuit 145A includes a static mapping circuit 300, a lead time mapping circuit 310, a delay time mapping circuit 320, a static response circuit 330, a lead response circuit 340, a delay response circuit 350 and a pseudo noise response circuit 360.

The static mapping circuit 300 receives the pieces of non-selected data INA of the corresponding input part IPA to perform mapping according to a static offset table TSA of the offset tables to generate a static mapping signal DSS.

The lead time mapping circuit 310 receives the pieces of non-selected data INA of the corresponding input part IPA to perform mapping according to a lead offset table TLA of the offset tables to generate a lead time mapping signal DSL.

The delay time mapping circuit 320 receives the pieces of non-selected data INA of the corresponding input part IPA to perform mapping according to a delay offset table TDA of the offset tables to generate a delay time mapping signal DSD.

In the mapping circuits described above, each of the offset tables includes a plurality of one-to-one corresponding relations between a plurality of codewords and a plurality of codeword offset values. The input codeword corresponds to one of the codewords in each of the offset tables. In an initial status, all the codeword offset values are set to be 0.

The static response circuit 330 receives the static mapping signal DSS to perform processing according to a group of static response coefficients CSA of the plurality of groups of response coefficients to generate a static output calibration signal CLS of a corresponding calibration part CIA.

The lead response circuit 340 receives the lead time mapping signal DSL to perform processing according to a group of lead response coefficients CLA of the plurality of groups of response coefficients to generate a lead output calibration signal CLL of the corresponding calibration part CIA.

The delay response circuit 350 receives the delay time mapping signal DSD to perform processing according to a group of delay response coefficients CDA of the plurality of groups of response coefficients to generate a delay output calibration signal CDL of the corresponding calibration part CIA.

The pseudo noise response circuit 360 receives the piece of selected data ISA of the corresponding input part IPA to perform processing according to a group of pseudo noise response coefficients CAN to generate a pseudo noise calibration signal CLN of the corresponding calibration part CIA.

The calibration circuits 145B~145D may include components and configurations identical to those of the calibration circuit 145A to perform processing according to the static offset tables TSB~TSD, the lead offset tables TLB~TLD, the delay offset tables TDB~TDD, the static response coefficients CSB~CSD, the lead response coefficients CLB~CLD, the delay response coefficients CDB~CDD and the pseudo noise response coefficients CNB~CND to generate the calibration parts CIB~CID, in which the calibration parts CIB~CID include the calibration signals identical to those included in the calibration parts CIA. The detail is not described herein.

In an embodiment, the digital-to-analog conversion apparatus 100 in FIG. 1 further includes an error calculation circuit 160 to calculate an error signal DIS that subtracts the calibration parts CIA~CID from the echo signal ES.

In an embodiment, the digital-to-analog conversion apparatus 100 in FIG. 1 further includes a remained echo canceling circuit 170, to further cancel the remained echo. The remained echo canceling circuit 170 includes a remained echo response circuit 180 (abbreviated as RER in FIG. 1) and a canceling circuit 190.

The remained echo response circuit 180 receives and processes the input digital signal IS according to a group of remained echo response coefficients CCR to generate a remained echo canceling signal ECR. The canceling circuit 190 subtracts the remained echo canceling signal ECR from the error signal DIS to generate a final error signal FDIS. The remained echo response circuit 180 converges the group of remained echo response coefficients CCR according to the final error signal FDIS.

The calibration parameter calculation circuit 150 generates a plurality of offsets according to the error signal DIS, which is a difference between the echo signal ES and the calibration signals that include the calibration parts CIA-CLD, and path information related to the echo calibration circuit 140. In an embodiment, the calibration parameter calculation circuit 150 actually generates the offsets according to the final error signal FDIS processed after the remained echo canceling circuit 170.

In an embodiment, the path information includes the path delays DL1~DL4 of the paths each from one of the response circuits (the static response circuit 330, the lead response circuit 340, the delay response circuit 350 and the pseudo noise response circuit 360) to the calibration parameter calculation circuit 150. Since the processing of these circuits takes time, the calibration parameter calculation circuit 150 needs to trace the calculated offsets back to the corresponding input codeword according to the path delays DL1~DL4.

In an embodiment, the calibration parameter calculation circuit 150 receives the static response coefficients CSA~CSD, the lead response coefficients CLA~CLD, the delay response coefficients CDA~CDD and the pseudo noise response coefficients CAN of the static response circuit 330, the lead response circuit 340, the delay response circuit 350 and the pseudo noise response circuit 360 of each of the calibration circuits 145A~145D, performs one-dimensional inversion respectively on these response coefficients, multiplies the values of the final error signal FDIS by the inversed response coefficients and accumulates the multiplication results to generate corresponding inverted offsets values. According to the path delays DL1~DL4, the calibration parameter calculation circuit 150 further sets each of the inverted offset values to be the offsets DAA~DAD corresponding to the static mapping circuit 300, the lead time mapping circuit 310, the delay time mapping circuit 320 of each of the calibration circuits 145A~145D.

It is appreciated that, the generation of the offsets described above is merely an example. In other embodiments, the calibration parameter calculation circuit 150 may generate the offsets by using other methods.

The echo calibration circuit 140 may perform training according to the final error signal FDIS and pseudo noise transmission path information from the conversion circuit 120 to the echo transmission circuit 130 to make each of the groups of response coefficients converge, to accomplish the object of performing calibration on the digital-to-analog conversion circuit 120. The pseudo noise transmission path information can be obtained by the feeding and transmission of the piece of selected data ISA-ISD.

In order to avoid the interaction between the training objects, the digital-to-analog conversion apparatus 100 performs training with different stages.

In a first training stage, each of the calibration circuits 145A~145D makes the pseudo noise response coefficients CNA~CND of the pseudo noise response circuit 360 converged according to the echo signal ES.

The static response circuit 330, the lead response circuit 340 and the delay response circuit 350 sets the static response coefficients CSA~CSD, the lead response coefficients CLA~CLD and the delay response coefficients CDA~CDD according to the converged pseudo noise response coefficients CNA~CND of each of the calibration circuits 145A~145D.

The setting of the response coefficients is described in detail in the following paragraphs.

In an embodiment, a target calibration circuit of the calibration circuits 145A~145D corresponds to a target input part of the input parts and to a group of converged target pseudo noise response coefficients. A lead calibration circuit of the calibration circuits 145A~145D receives a lead input part relative to the target input part and corresponds to a group of converged lead pseudo noise response coefficients. A delay calibration circuit of the calibration circuits 145A~145D receives a delay input part relative to the target input part and corresponds to a group of converged delay pseudo noise response coefficients.

For example, since the calibration circuits 145A~145D keeps receiving input parts IPA~IPD in turn, when the target calibration circuit is the calibration circuit 145B, the target input part thereof is the input part IPB and the converged target pseudo noise response coefficients thereof are the pseudo noise response coefficients CBN.

The lead calibration circuit is the calibration circuit 145A, the lead input part thereof is the input part IPA and the converged target pseudo noise response coefficients thereof are the pseudo noise response coefficients CNA. The delay calibration circuit is the calibration circuit 145C, the delay input part thereof is the input part IPC and the converged target pseudo noise response coefficients thereof are the pseudo noise response coefficients CCN.

The static response circuit 330 of the target calibration circuit 145B sets the static response coefficients CSB to equal the converged target pseudo noise response coefficients CBN.

The lead response circuit 340 of the target calibration circuit 145B sets the lead response coefficients CLB according to the converged target pseudo noise response coefficients CBN and the converged lead pseudo noise response coefficients CNA. In an embodiment, the lead response circuit 340 of the target calibration circuit 145B adds the converged target pseudo noise response coefficients CBN having the sign reversed and the converged lead pseudo noise response coefficients CAN to set the lead response coefficients CLB. As a result, the lead response coefficients CLB is expressed as −CBN+CNA.

The delay response circuit 350 of the target calibration circuit 145A sets the delay response coefficients CDB according to the converged target pseudo noise response coefficients CNA and converged delay pseudo noise response coefficients CCN. In an embodiment, the delay response circuit 350 of the target calibration circuit 145A adds the converged target pseudo noise response coefficients CBN having the sign reversed and the converged delay pseudo noise response coefficients CCN to set the delay response coefficients CDB. As a result, the delay response coefficients CDB is expressed as −CBN+CCN.

Identically, when the target calibration circuit is the calibration circuit 145C, the converged target pseudo noise response coefficients thereof is the pseudo noise response coefficients CCN. The static response circuit 330 of the calibration circuit 145C sets the static response coefficients CSB to equal the converged target pseudo noise response coefficients CBN. The lead response circuit 340 of the calibration circuit 145C adds the converged target pseudo noise response coefficients CCN having the sign reversed and the converged lead pseudo noise response coefficients CBN to sets the lead response coefficients CLC represented by −CCN+CBN. The delay response circuit 350 of the calibration circuit 145C adds the converged target pseudo noise response coefficients CCN having the sign reversed and the converged delay pseudo noise response coefficients CDN to set the delay response coefficients CDC represented by −CCN+CDN.

In an embodiment, when the target calibration circuit corresponds to a most leading part of the input part IPA~IPD, the lead response circuit 340 left-shifts the converged lead pseudo noise response coefficients and fills 0 thereto to perform adding subsequently.

For example, when the target calibration circuit is the calibration circuit 145A, the most leading part of the input part IPA~IPD is IPA. The static response circuit 330 of the calibration circuit 145A sets the static response coefficients CSA to equal to the converged target pseudo noise response coefficients CNA. The lead response circuit 340 of the calibration circuit 145A adds the converged target pseudo noise response coefficients CNA having the sign reversed and the converged lead pseudo noise response coefficients CDN that are left-shifted and filled with 0s to set the lead response coefficients CLA represented by −CNA+[CDN(2: end) 0]. The delay response circuit 350 of the calibration circuit 145A still adds the converged target pseudo noise response coefficients CNA having the sign reversed and the converged delay pseudo noise response coefficients CBN to set the delay response coefficients CDA represented by −CNA+CBN.

In an embodiment, when the target calibration circuit corresponds to a most delayed part of the input part IPA~IPD, the delay response circuit 350 subtracts one from a last term of the converged delay pseudo noise response coefficients to perform adding subsequently.

For example, when the target calibration circuit is the calibration circuit 145D, the most delayed part of the input parts IPA~IPD is the input part IPD. The static response circuit 330 of the calibration circuit 145D sets the static response coefficients CSD to equal the converged target pseudo noise response coefficients CDN. The lead response circuit 340 of the calibration circuit 145D still adds the converged target pseudo noise response coefficients CDN having the sign reversed and the converged lead pseudo noise response coefficients CCN to set the lead response coefficients CLD represented by –CDN+CCN. The delay response circuit 350 of the calibration circuit 145D adds the converged target pseudo noise response coefficients CDN having the sign reversed and the converged delay pseudo noise response coefficients CAN having the last term being subtracted by 1 to set the delay response coefficients CDD represented by –CDN+[CNA (1: end)–1].

In a second training stage, each of the calibration circuits 145A~145D updates one of the static offset tables TSA~TSD, the lead offset tables TLA~TLD, the delay offset tables TDA~TDD according to the offsets DAA~DAD related to each of the calibration circuits 145A~145D.

In an embodiment, In an embodiment, the offset values of the current sources included in the conversion circuit 120 have different combinations generated according to different combinations of the input codewords such that a mapping relation exists between the offset values of the current sources and the offset values of the input codewords. In the second training stage, the calibration parameter calculation circuit 150 distinguishes the offset values that the different input codewords correspond to into a plurality of value groups according to an operation status of each of the current sources. The calibration parameter calculating circuit 150 further sets each of the current sources to be a target current source to further set a corresponding current offset value calculation formula. The current offset value calculation formula is a subtraction result of two of the value groups such that the current offset value of each of the current sources besides the target current source cancels out in the two value groups.

The calibration parameter calculation circuit 150 substitutes the offset DAA~DAD to the current offset value calculation formula that each of the current sources corresponds to, so as to calculate the current offset value of the target current source. The calibration parameter calculating circuit 150 further converts the current offset value of the current sources to a plurality of codeword offset values to update the static offset tables TSA~TSD, the lead offset tables TLA~TLD and the delay offset tables TDA~TDD. The detail calculation process that the calibration parameter calculation circuit 150 performs to calculate the current offsets according to the offsets DAA~DAD, converts the current offsets to the codeword offsets and further updates the offset tables accordingly can be referred to U.S. patent application Ser. No. 17/691,502. The detail is not described herein.

In an embodiment, the remained echo response circuit 180 sets the remained echo response coefficients CCR within a predetermined range such that the calibration parameter calculation circuit 150 performs calculation accordingly to lower the degrees of freedom and decrease the interaction of the system. In an embodiment, a lower limit of such a predetermined range can be $-1 \times 10^{-2}$, and an upper limit of such a predetermined range can be $+1 \times 10^{-2}$. However, the present invention is not limited thereto.

By using the method described above, the calibration parameter calculation circuit 150 can update the static offset tables TSA~TSD, the lead offset tables TLA~TLD, the delay offset tables TDA~TDD related to each of the calibration circuits 145A~145D.

In an embodiment, the conversion circuit 120 may further include a control circuit (not illustrated in the figure) to sort the current offset values that the current sources correspond to, so as to generate a turn-on order to turn on the current sources according to the input codeword based on the turn-on order by using a thermometer control mechanism such that a linearity of the current sources when the current sources turn on according to the turn-on order is larger than a predetermined value. The setting of the turn-on order can be performed by using different methods and is not described herein.

As a result, the digital-to-analog conversion apparatus 100 of the present invention generates an output analog signal and an echo canceling analog signal each having a first frequency, to operate internal circuits under a second frequency that is 1/N of the first frequency by downsampling an echo signal and further use partial information of the input digital signal as a pseudo noise feeding such that a calibration of the echo canceling mechanism can be performed without an additional pseudo noise generating source.

It is appreciated that, the condition that N is 4 is used in the embodiments described above. However, N can be any positive integer and is preferable to be a multiple of 2. The present invention is not limited thereto.

Reference is now made to FIG. 4. FIG. 4 illustrates a flow chart of a digital-to-analog conversion method 400 having a signal calibration mechanism according to an embodiment of the present invention.

Besides the apparatus described above, the present invention further discloses the digital-to-analog conversion method 400 that can be used in such as, but not limited to the digital-to-analog conversion apparatus 100 illustrated in FIG. 1. An embodiment of the digital-to-analog conversion method 400 is illustrated in FIG. 4 and includes the steps outlined below.

In step S410, the digital-to-analog conversion is performed according to the signal feeding related to the input digital signal IS having the set of input codeword by the conversion circuit 120 including the current sources operating under the first frequency, to generate the output analog signal OD, wherein the input digital signal IS includes the N input parts arranged in an order with an equal size, N being a positive integer larger than 1.

In step S420, the signal processing that includes downsampling is performed on the echo path EP by the echo transmission circuit 130 to generate the echo signal ES having the second frequency, wherein the second frequency is 1/N of the first frequency.

In step S430, the piece of selected data of one of the N input parts is received as the pseudo noise feeding and the plurality of pieces of non-selected data are received as the signal feeding by each of N calibration circuits operating under the second frequency included by the echo calibration circuit 140, to perform mapping according to the plurality of offset tables and perform processing according to the plurality of groups of response coefficients to generate one of N calibration parts of the calibration signal.

In step S440, the plurality of offsets are generated according to the error signal DIS between the echo signal ES and the calibration signal and path information related to the echo calibration circuit by the calibration parameter calculation circuit 150 operating under the second frequency.

In step S450, the groups of response coefficients are converged according to the error signal ES and pseudo noise transmission path information from the conversion circuit 120 to the echo transmission circuit 130, and the offset tables are further updated according to the offsets by the echo calibration circuit 140.

It is appreciated that the embodiments described above are merely an example. In other embodiments, it is appreciated that many modifications and changes may be made by those of ordinary skill in the art without departing, from the spirit of the invention.

In summary, the digital-to-analog conversion apparatus and the digital-to-analog conversion method having a signal calibration mechanism The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A digital-to-analog conversion apparatus having a signal calibration mechanism, comprising:

a conversion circuit comprising a plurality of current sources operating under a first frequency to perform digital-to-analog conversion according to a signal feeding related to an input digital signal having a set of input codeword to generate an output analog signal, wherein the input digital signal comprises N input parts arranged in an order with an equal size, N being a positive integer larger than 1;

an echo transmission circuit to perform signal processing that comprises down-sampling on an echo path to generate an echo signal having a second frequency, wherein the second frequency is 1/N of the first frequency;

an echo calibration circuit comprising N calibration circuits operating under the second frequency, each receiving a piece of selected data of one of the N input parts as a pseudo noise feeding and a plurality of pieces of non-selected data as a signal feeding to perform mapping according to a plurality of offset tables and perform processing according to a plurality of groups of response coefficients to generate one of N calibration parts of a calibration signal; and a calibration parameter calculation circuit operating under the second frequency to generate a plurality of offsets according to an error signal between the echo signal and the calibration signal and path information related to the echo calibration circuit, wherein the echo calibration circuit makes the groups of response coefficients converge according to the error signal and pseudo noise transmission path information from the conversion circuit to the echo transmission circuit, and further updates the offset tables according to the offsets.

2. The digital-to-analog conversion apparatus of claim 1, further comprising a signal input circuit to perform signal feeding on the conversion circuit, the signal input comprising N feeding circuits each retrieving and outputting one of the N input parts of the input digital signal.

3. The digital-to-analog conversion apparatus of claim 1, wherein each of the N calibration circuits comprises:

a static mapping circuit to receive the pieces of non-selected data of one of a corresponding input part of the N input parts of the input digital signal to perform mapping according to a static offset table of the offset tables to generate a static mapping signal;

a lead time mapping circuit to receive the pieces of non-selected data of the corresponding input part to perform mapping according to a lead offset table of the offset tables to generate a lead time mapping signal;

a delay time mapping circuit to receive the pieces of non-selected data of the corresponding input part to perform mapping according to a delay offset table of the offset tables to generate a delay time mapping signal;

a static response circuit to receive the static mapping signal to perform processing according to a group of static response coefficients of the plurality of groups of response coefficients to generate a static output calibration signal of a corresponding calibration part of the N calibration parts of the calibration signal;

a lead response circuit to receive the lead time mapping signal to perform processing according to a group of lead response coefficients of the plurality of groups of response coefficients to generate a lead output calibration signal of the corresponding calibration part;

a delay response circuit to receive the delay time mapping signal to perform processing according to a group of delay response coefficients of the plurality of groups of response coefficients to generate a delay output calibration signal of the corresponding calibration part; and a pseudo noise response circuit to receive the piece of selected data of the corresponding input part to perform processing according to a group of pseudo noise response coefficients to generate a pseudo noise calibration signal of the corresponding calibration part.

4. The digital-to-analog conversion apparatus of claim 3, wherein in a first training stage, each of the N calibration circuits makes the group of pseudo noise response coefficients converge of the pseudo noise response circuit according to the echo signal, and the static response circuit, the lead response circuit and the delay response circuit thereof respectively set the group of static response coefficients, the group of lead response coefficients and the group of lead response coefficients to be the group of converged pseudo noise response coefficients; and in a second training stage, each of the N calibration circuits updates one of the offset tables according to the offsets related to each of the calibration circuits.

5. The digital-to-analog conversion apparatus of claim 4, wherein a target calibration circuit of the N calibration circuits corresponds to a target input part of the N input parts and to a group of converged target pseudo noise response coefficients, a lead calibration circuit of the N calibration circuits receives a lead input part relative to the target input part and corresponds to a group of converged lead pseudo noise response coefficients, and a delay calibration circuit of the N calibration circuits receives a delay input part relative to the target input part and corresponds to a group of converged delay pseudo noise response coefficients;

the static response circuit of the target calibration circuit sets the group of static response coefficients to equal the group of converged target pseudo noise response coefficients, the lead response circuit sets the group of lead response coefficients according to the group of converged target pseudo noise response coefficients and the group of converged lead pseudo noise response coefficients, and the delay response circuit sets the group of delay response coefficients according to the group of converged target pseudo noise response coefficients and the group of converged delay pseudo noise response coefficients.

6. The digital-to-analog conversion apparatus of claim 5, wherein the lead response circuit of the target calibration circuit adds the group of converged target pseudo noise response coefficients having the sign reversed and the group of converged lead pseudo noise response coefficients to set the group of lead response coefficients, and the delay response circuit adds the group of converged target pseudo noise response coefficients having the sign reversed and the group of converged lead pseudo noise response coefficients to set the group of delay response coefficients.

7. The digital-to-analog conversion apparatus of claim 6, wherein when the target calibration circuit corresponds to a most leading part of the N input parts, the lead response circuit left-shifts the group of converged lead pseudo noise response coefficients and fills 0 thereto to perform adding subsequently;

when the target calibration circuit corresponds to a most delayed part of the N input parts, the delay response circuit subtracts one from a last term of the group of converged delay pseudo noise response coefficients to perform adding subsequently.

8. The digital-to-analog conversion apparatus of claim 1, further comprising a remained echo canceling circuit that comprises:

a remained echo response circuit to receive and process the input digital signal according to group of remained echo response coefficients to generate remained echo canceling signal; and a canceling circuit subtracts the remained echo canceling signal from the error signal to generate a final error signal;

wherein the remained echo response circuit converges the group of remained echo response coefficients according to the final error signal and the calibration parameter calculation circuit actually generates the offsets according to the final error signal and path information related to the echo calibration circuit.

9. The digital-to-analog conversion apparatus of claim 8, wherein the remained echo response circuit sets the group of remained echo response coefficients within a predetermined range.

10. The digital-to-analog conversion apparatus of claim 1, wherein the input digital signal IS generated by over-sampling an original digital signal having a set of original codeword, the conversion circuit comprises a plurality of current sources, and the current sources comprise a selected current source and a plurality of non-selected current sources the piece of selected data corresponds to the selected current source and the pieces of non-selected data correspond to the non-selected current sources;

wherein among the N input parts and the original codeword, the piece of selected data has a minimum data correlation with the pieces of non-selected data.

11. A digital-to-analog conversion method having a signal calibration mechanism, used in a digital-to-analog conversion apparatus, comprising:

performing digital-to-analog conversion according to a signal feeding related to an input digital signal having a set of input codeword by a conversion circuit comprising a plurality of current sources operating under a first frequency, to generate an output analog signal, wherein the input digital signal comprises N input parts arranged in an order with an equal size, N being a positive integer larger than 1;

performing signal processing that comprises down-sampling on an echo path by an echo transmission circuit to generate an echo signal having a second frequency, wherein the second frequency is 1/N of the first frequency;

receiving a piece of selected data of one of the N input parts as a pseudo noise feeding and a plurality of pieces of non-selected data as a signal feeding by each of N calibration circuits operating under the second frequency comprised by an echo calibration circuit, to perform mapping according to a plurality of offset tables and perform processing according to a plurality of groups of response coefficients to generate one of N calibration parts of a calibration signal; and generating a plurality of offsets according to an error signal between the echo signal and the calibration signal and path information related to the echo calibration circuit by a calibration parameter calculation circuit operating under the second frequency; and making the groups of response coefficients converge according to the error signal and pseudo noise transmission path information from the conversion circuit to the echo transmission circuit, and further updating the offset tables according to the offsets by the echo calibration circuit.

12. The digital-to-analog conversion method of claim 11, further comprising:

performing signal feeding on the conversion circuit by a signal input circuit, the signal input comprising N feeding circuits each retrieving and outputting one of the N input parts of the input digital signal.

13. The digital-to-analog conversion method of claim 11, further comprising:

receiving the pieces of non-selected data of one of a corresponding input part of the N input parts of the input digital signal by a static mapping circuit of each of the N calibration circuits to perform mapping according to a static offset table of the offset tables to generate a static mapping signal;

receiving the pieces of non-selected data of the corresponding input part by a lead time mapping circuit of each of the N calibration circuits to perform mapping according to a lead offset table of the offset tables to generate a lead time mapping signal;

receiving the pieces of non-selected data of the corresponding input part by a delay time mapping circuit of each of the N calibration circuits to perform mapping according to a delay offset table of the offset tables to generate a delay time mapping signal;

receiving the static mapping signal to perform processing according to a group of static response coefficients of the plurality of groups of response coefficients by a static response circuit of each of the N calibration circuits to generate a static output calibration signal of a corresponding calibration part of the N calibration parts of the calibration signal;

receiving the lead time mapping signal to perform processing according to a group of lead response coefficients of the plurality of groups of response coefficients by a lead response circuit of each of the N calibration circuits to generate a lead output calibration signal of the corresponding calibration part;

receiving the delay time mapping signal to perform processing according to a group of delay response coefficients of the plurality of groups of response coefficients by a delay response circuit of each of the N calibration circuits to generate a delay output calibration signal of the corresponding calibration part; and receiving the piece of selected data of the corresponding input part to perform processing according to a group of pseudo noise response coefficients by a pseudo noise response circuit of each of the N calibration circuits to generate a pseudo noise calibration signal of the corresponding calibration part.

14. The digital-to-analog conversion method of claim 13, further comprising:

in a first training stage, making the group of pseudo noise response coefficients converge of the pseudo noise response circuit according to the echo signal by each of the N calibration circuits, and respectively setting the group of static response coefficients, the group of lead response coefficients and the group of lead response coefficients to be the group of converged pseudo noise response coefficients by the static response circuit, the lead response circuit and the delay response circuit thereof; and in a second training stage, updating one of the offset tables according to the offsets related to each of the calibration circuits by each of the N calibration circuits.

15. The digital-to-analog conversion method of claim 14, further comprising:

corresponding to a target input part of the N input parts and to a group of converged target pseudo noise response coefficients by a target calibration circuit of the N calibration circuits, receiving a lead input part relative to the target input part and corresponding to a group of converged lead pseudo noise response coefficients by a lead calibration circuit of the N calibration circuits, and receiving a delay input part relative to the target input part and corresponding to a group of converged delay pseudo noise response coefficients by a delay calibration circuit of the N calibration circuits; and setting the group of static response coefficients to equal the group of converged target pseudo noise response coefficients by the static response circuit of the target calibration circuit, setting the group of lead response coefficients according to the group of converged target pseudo noise response coefficients and the group of converged lead pseudo noise response coefficients by the lead response circuit, and setting the group of delay response coefficients according to the group of converged target pseudo noise response coefficients and the group of converged delay pseudo noise response coefficients by the delay response circuit.

16. The digital-to-analog conversion method of claim 15, further comprising:

adding the group of converged target pseudo noise response coefficients having the sign reversed and the group of converged lead pseudo noise response coefficients to set the group of lead response coefficients by the lead response circuit of the target calibration circuit, and adding the group of converged target pseudo noise response coefficients having the sign reversed and the group of converged lead pseudo noise response coefficients to set the group of delay response coefficients by the delay response circuit.

17. The digital-to-analog conversion method of claim 16, further comprising:

left-shifting the group of converged lead pseudo noise response coefficients and filling 0 thereto to perform adding subsequently by the lead response circuit when the target calibration circuit corresponds to a most leading part of the N input parts; and subtracting one from a last term of the group of converged delay pseudo noise response coefficients to perform adding subsequently by the delay response circuit when the target calibration circuit corresponds to a most delayed part of the N input parts.

18. The digital-to-analog conversion method of claim 11, further comprising:

receiving and processing the input digital signal according to group of remained echo response coefficients by a remained echo response circuit of a remained echo canceling circuit to generate remained echo canceling signal;

subtracting the remained echo canceling signal from the error signal by a canceling circuit of the remained echo canceling circuit to generate a final error signal; and converging the group of remained echo response coefficients according to the final error signal by the remained echo response circuit and actually generating the offsets according to the final error signal and path information related to the echo calibration circuit by the calibration parameter calculation circuit.

19. The digital-to-analog conversion method of claim 18, further comprising:

setting the group of remained echo response coefficients within a predetermined range by the remained echo response circuit.

20. The digital-to-analog conversion method of claim 11, wherein the input digital signal IS generated by oversampling an original digital signal having a set of original codeword, the conversion circuit comprises a plurality of current sources, and the current sources comprise a selected current source and a plurality of non-selected current sources the piece of selected data corresponds to the selected current source and the pieces of non-selected data correspond to the non-selected current sources;

wherein among the N input parts and the original codeword, the piece of selected data has a minimum data correlation with the pieces of non-selected data.

* * * * *